United States Patent [19]

Orchard-Webb

[11] Patent Number: 5,568,346
[45] Date of Patent: Oct. 22, 1996

[54] ESD PROTECTION CIRCUIT

[75] Inventor: Jonathan H. Orchard-Webb, Kanata, Canada

[73] Assignee: Mitel Corporation, Kanata, Canada

[21] Appl. No.: 385,706

[22] Filed: Feb. 8, 1995

[30] Foreign Application Priority Data

Feb. 8, 1994 [CA] Canada ..................... 2115230

[51] Int. Cl.$^6$ ..................................... H02H 9/04
[52] U.S. Cl. ................. 361/58; 361/56; 361/111; 361/91
[58] Field of Search ................. 361/56, 91, 98, 361/111, 96

[56] References Cited

U.S. PATENT DOCUMENTS 4,066,918  1/1978  Heuner et al. ................. 361/56
4,736,271  4/1988  Mack et al. ................... 361/91
5,189,588  7/1990  Yano et al. ................... 361/56

FOREIGN PATENT DOCUMENTS 0148577  11/1984  European Pat. Off. .
93/15541  8/1993  WIPO .

*Primary Examiner*—Todd DeBoer
*Attorney, Agent, or Firm*—Marks & Clerk

[57] ABSTRACT

A input circuit provides ESD protection to an integrated circuit comprising a $V_{dd}$ pad, a $V_{ss}$ pad, a plurality of input and output pads, a $V_{dd}$ power rail, and a $V_{ss}$ power rail. A large diode sufficient to carry ESD current is placed directly between the $V_{ss}$ pad and the $V_{dd}$ power rail, and the input pads are connected to the $V_{dd}$ power rail through respective diodes.

4 Claims, 4 Drawing Sheets

5,568,346

ESD PROTECTION CIRCUIT

BACKGROUND OF THE INVENTION

The present invention relates to a protection circuit for providing ESD (electrostatic discharge) protection for integrated circuits.

ESD is a common problem in any monolithic IC circuit, such as CMOS, BICMOS, and bipolar. Static charges can build up high voltages which when discharged through the leads of integrated circuits can cause catastrophic failure. In the prior art, it was known, for example, to protect CMOS circuits by using an input resistor followed by a diode to the $V_{dd}$ power rail and a diode to the $V_{ss}$ power rail for each input pad. The separate diode to $V_{ss}$ was used for each input to protect it against ESD discharges between that input and $V_{ss}$.

The problem with this arrangement is that the diodes to $V_{ss}$ are placed at each input pad and consume significant die area, thereby incurring a significant cost penalty. Furthermore, the $V_{ss}$ diodes are close to active circuitry, and care has to be taken to prevent latch-up problems caused by the protection diodes.

SUMMARY OF THE INVENTION

The present invention provides a protection circuit for providing ESD protection to an integrated circuit comprising a $V_{dd}$ pad, $V_{ss}$ pad, a plurality of input and output pads, a $V_{dd}$ power rail, and a $V_{ss}$ power rail. In accordance with the invention, a single diode, (or protection network), sufficient to carry ESD current is placed directly between the $V_{ss}$ pad and the $V_{dd}$ power rail, thereby obviating the need to connect each input pad to the $V_{ss}$ rail through separate diodes. The protection circuit from any input/output pad, to $V_{ss}$ is completed though the diode at the I/O pad and the scribe ring and substrate and a similar diode at the $V_{ss}$ pad.

The use of a single diode increases the protection level for ESD events between a single pad and $V_{ss}$ to the same level as that achieved between different signal pads. Furthermore, it saves die area and reduces the risk of latch-up.

The invention, although described with reference to CMOS on N-substrates, is applicable to any monolithic IC process, such a CMOS, BICMOS, and bipolar.

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figure 1:
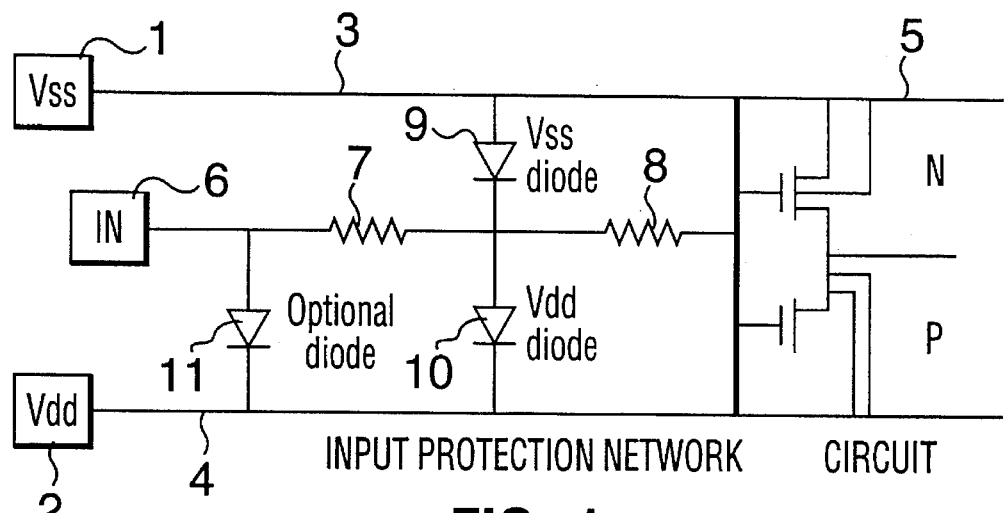
FIG. 1 is a circuit diagram of a prior art input protection circuit.

Referring to FIG. 1, the prior art input protection circuit comprises a $V_{ss}$ pad 1 and a $V_{dd}$ pad 2 connected respectively to supply rails 3, 4 providing power to the active circuit generally designated 5. An input pad 6 is connected through a protection resistor 7 and an input resistor 8 or conductor to the active circuit 5. The input resistor has no role in protection; it merely serves as a convenient connection.

The input line between resistors 7 and 8 is connected respectively via $V_{ss}$ diode 9 to $V_{ss}$ rail 3 and $V_{dd}$ diode 10 to $V_{dd}$ rail 4. An optional diode 11 may connect the input pad 6 directly to $V_{dd}$ rail.

Figure 2:
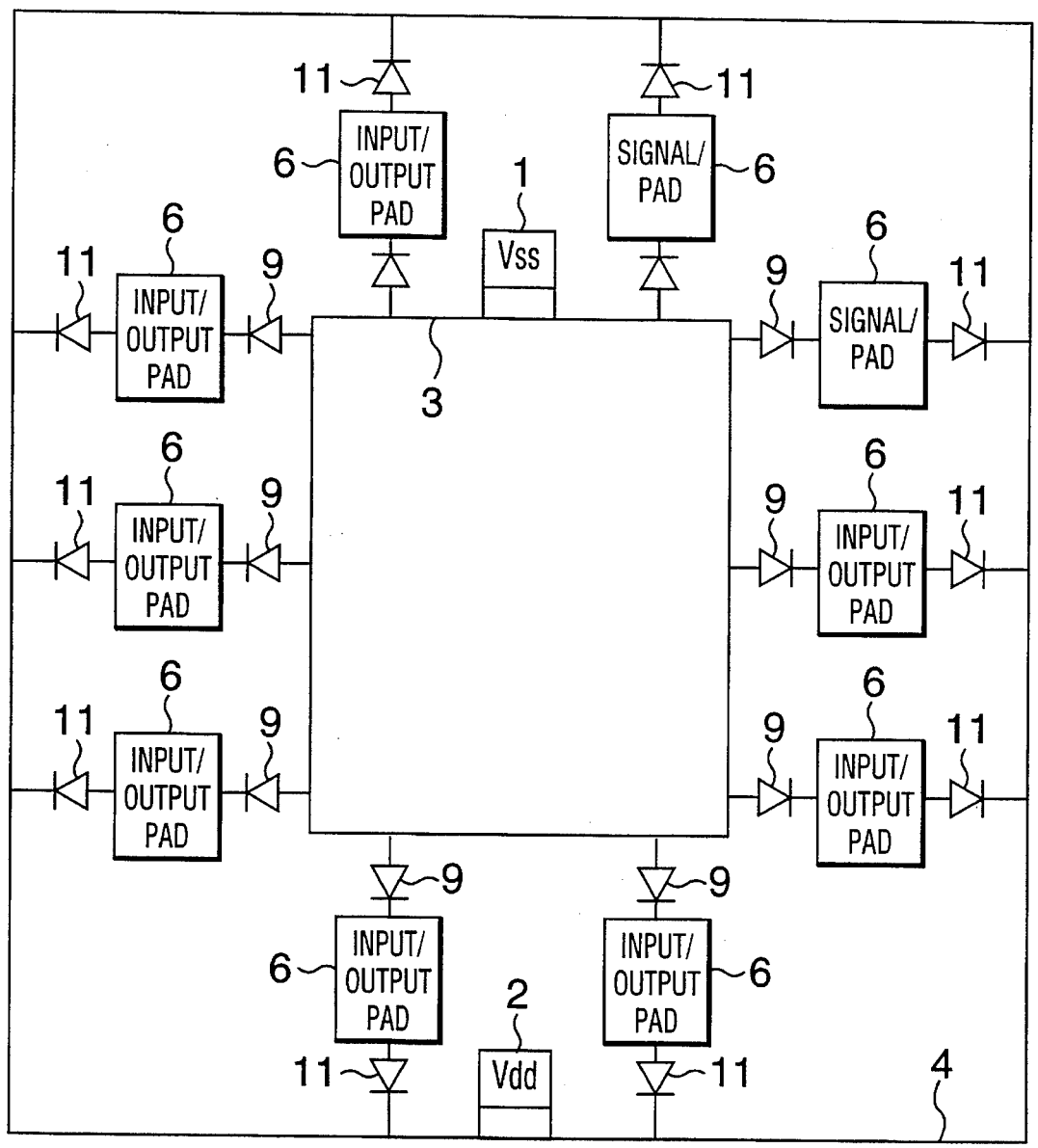
FIG. 2 shows schematically the physical layout of the contact pads for a prior art integrated circuit (input resistors are omitted for the sake of clarity)

FIG. 2 shows the physical layout of the circuit shown in FIG. 1 with signal pads 6 connected through $V_{ss}$ diode 9 to $V_{ss}$ rail 3 and $V_{dd}$ diode 10 to $V_{dd}$ rail 4.

In the circuit shown in FIGS. 1 and 2, if the ESD impulse occurs across two pads, for example, two signal pads, the diode at the negative pad will break down. Current flows to the substrate and the scribe metal ($V_{dd}$ in this particular embodiment) and forward biases the diode on the negative pad. If the ESD voltages are reversed, the same action occurs except that the roles of the two diodes are reversed. If the discharge occurs across several pads, the action is similar but with more diodes brought into play.

It can be seen that the diode on $V_{ss}$ will act in the same way as diodes on any other input or output pad, both for discharge between input or output pads and $V_{ss}$, and for discharges between $V_{ss}$ and $V_{dd}$.

The individual $V_{ss}$ diodes 9 thus protect the inputs against ESD discharges to $V_{ss}$. However, as more clearly shown in FIG. 2, the proximity of the diodes 9 to the active circuitry means that extreme care has to be taken to prevent latch-up problems, and also the presence of the diodes 9 close to the active circuitry substantially increases the physical size of the device.

Figure 3:
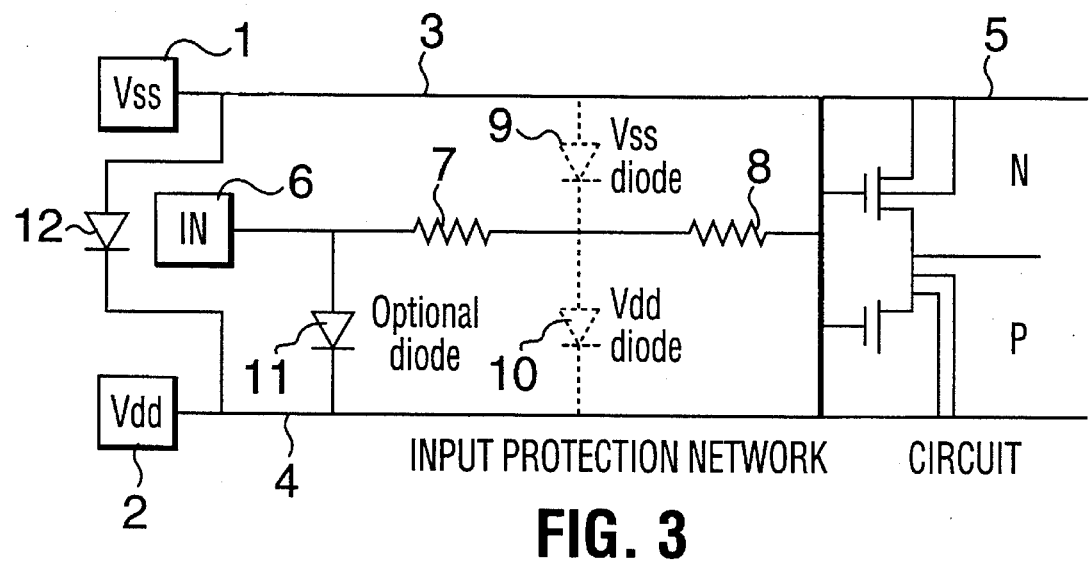
FIG. 3 shows an input protection circuit in accordance with the invention in its simplest form with only the previously optional diode retained.
Figure 4:
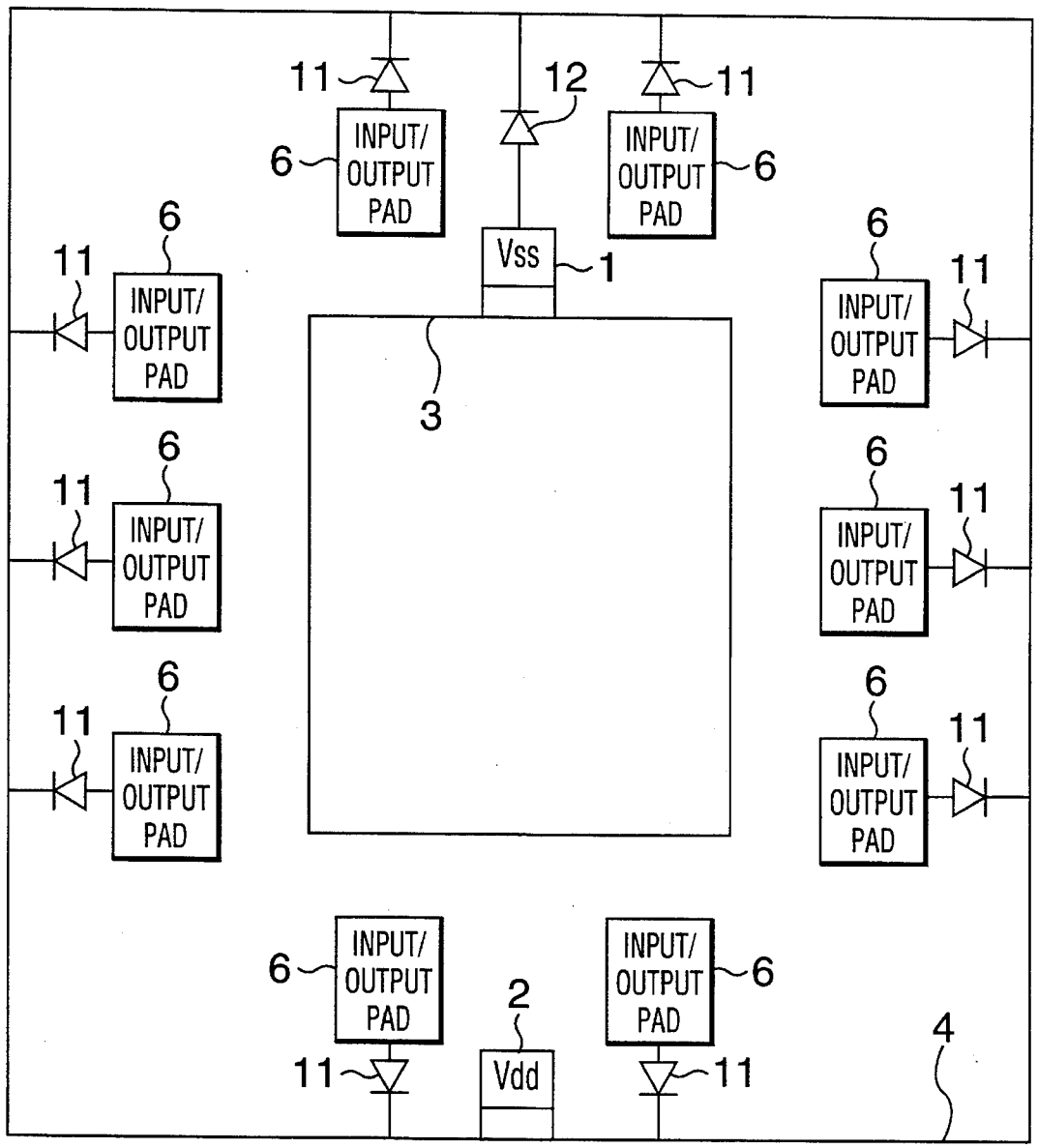
FIG. 4 shows schematically the physical layout of an integrated circuit constructed in accordance with the invention.

Referring now to FIGS. 3 and 4, where like parts are referenced with like reference numerals, input resistor 7, and the $V_{ss}$ and $V_{dd}$ diodes 9 and 10 of FIG. 1 are removed, as indicated by the dotted outline in FIG. 3. Instead, a single $V_{ss}$ diode 12 (preferably a large diode which is capable of withstanding the ESD impulse), or diode network similar to diode 11, is placed directly between the $V_{ss}$ pad 1, or at least a point on the $V_{ss}$ power rail close thereto, and the $V_{dd}$ power rail 4. A similar diode 11 is connected between all the remaining pads 6, except the $V_{dd}$ pad 2, and the $V_{dd}$ power rail 4. Unlike the configuration shown in FIG. 1, diode 11 is now essential.

The physical arrangement is shown in FIG. 4, where diode 12 can be seen located between the $V_{ss}$ pad 1 and the $V_{dd}$ rail 4. Diode 11 connects each input pad to $V_{dd}$.

For complete ESD protection, the circuit has to withstand ESD discharges between every possible pair of pads both for positive and negative discharges.

If the input pad is negative (6a), the input pad diode 11 breaks down and provides a low resistance path to $V_{dd}$, as in the prior art. If on the other hand the signal pad is positive, the same diode 11 forward biases to the substrate, which then causes the $V_{ss}$ diode 12 to break down and provide a low resistance path to discharge the ESD event.

Figure 5:
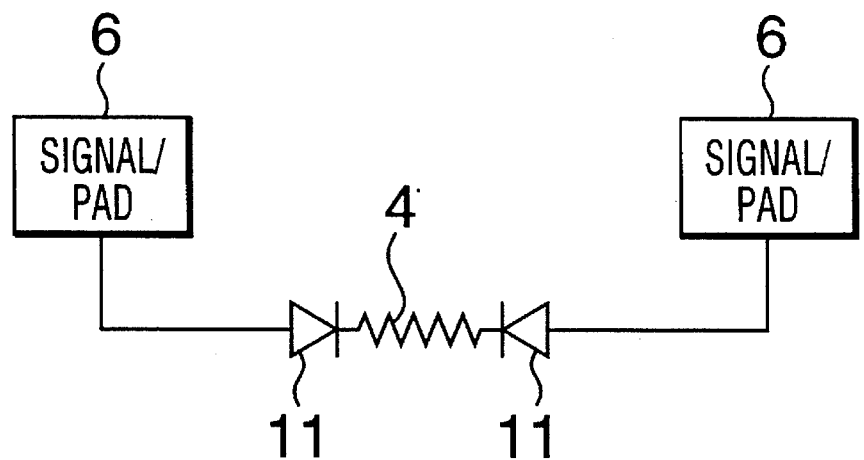
FIG. 5 illustrates how breakdown occurs between pads in the arrangement according to the invention.

As shown in FIG. 5, where the $V_{dd}$ power rail 4 is constituted by the substrate, pad-to-pad breakdown occurs through the substrate 4 and back-to-back diodes 11, one being forward biased and the other being reverse biased.

Figure 6:
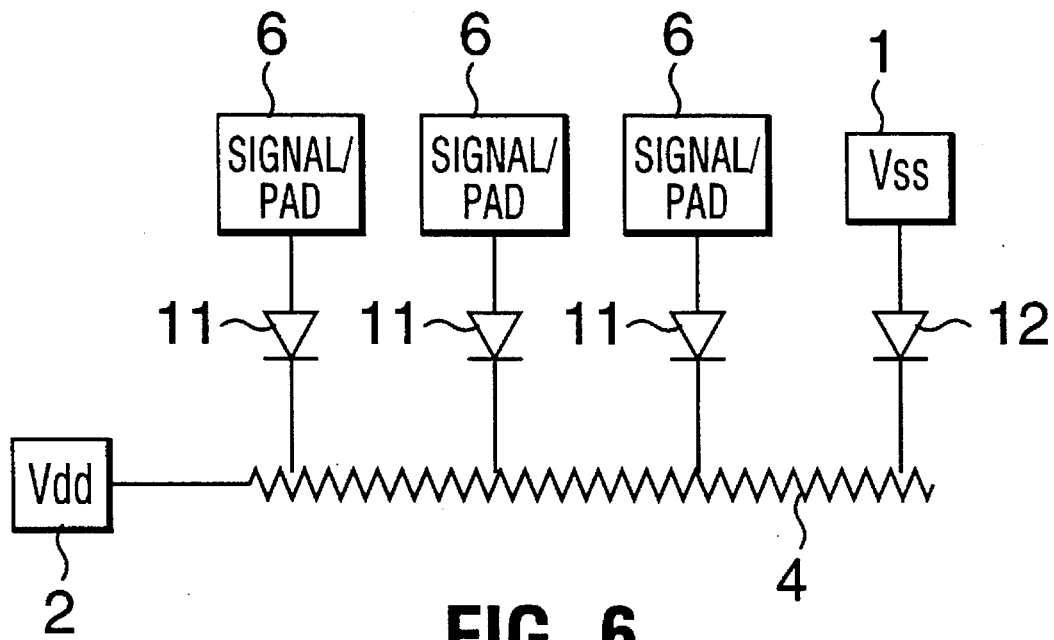
FIG. 6 is an electrical equivalent diagram of the protection circuit.

FIG. 6 illustrates what occurs in the event of $V_{ss}$ to $V_{dd}$ breakdown. Discharge occurs through just one diode 12 connecting pad 1 ($V_{ss}$) to the $V_{dd}$ rail 4.

With the arrangement described, unlike the prior art (compare FIGS. 2 and 3) only one diode is required at each pad to discharge both positive and negative events. The protection circuit from any input/output (signal) pad, to $V_{ss}$ is completed though the diode at the I/O pad and the scribe ring (not shown) and substrate and a similar diode at the $V_{ss}$ pad. The substrate and scribe ring (not shown) thus serve to connect the back-to-back diodes between pads. This arrangement offers a low resistance.

The design of the diodes is not critical to the invention, and many designs can be employed within the skill of the person skilled in the art. Any device, network or combination of devices that fulfill the role of a diode can be employed and variations in implementation depend on the specific type of technology used. The key feature is that the diode 12 must be sufficiently large to carry ESD current from one or more input pads and furthermore it must not break down under normal operating voltage. Ideally all the diodes should be identical.

The invention has been described for an n-type substrate. For p-type substrates the roles of the $V_{dd}$ and $V_{ss}$ pads are exchanged.

I claim:

1. A protection circuit for providing ESD protection to an integrated circuit, comprising a substrate; first and second supply pads; first and second power rails connected to said first and second respective supply pads, said first power rail being connected to said substrate; a plurality of signal pads that are not electrically connected to said second power rail; first diode means sufficient to carry ESD current, said first diode means being directly connected between said second supply pad and said first power rail; a plurality of second diode means respectively directly connected between each said signal pad and said first power rail, whereby discharge between any of said signal pads occurs sequentially through one said second diode means, said substrate, and another said second diode means, said one and said another second diode means being in a back-to-back relationship, discharge between said supply pads occurs through said first diode means connected to said second said supply pad and said substrate, and discharge between a said signal pad and said second supply pad occurs through a said second diode means, said substrate and said first diode means.

2. A protection circuit as claimed in claim 1, wherein said diode means comprises a diode network.

3. A protection circuit as claimed in claim 1, wherein said substrate is p-type and said first power rail is a $V_{ss}$ power rail.

4. A protection circuit as claimed in claim 1, wherein said substrate is n-type and said first power rail is a $V_{dd}$ power rail.

* * * * *